United States Patent
Cutler

(10) Patent No.: US 6,430,465 B2
(45) Date of Patent: Aug. 6, 2002

(54) ABBE ERROR CORRECTION SYSTEM AND METHOD

(75) Inventor: Donald R. Cutler, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 0 days.

(21) Appl. No.: 09/755,950

(22) Filed: Jan. 5, 2001

Related U.S. Application Data

(60) Provisional application No. 60/175,993, filed on Jan. 11, 2000.

(51) Int. Cl.[7] ............................................. G06F 19/00
(52) U.S. Cl. ..................... 700/193; 700/54; 700/56; 700/57; 700/58; 700/186; 700/192; 318/569; 318/571; 318/568.17; 318/590; 318/592
(58) Field of Search .................... 200/54–56, 57–61, 200/66, 69–71, 114, 185–186, 302, 159, 191–195; 318/569, 571, 590, 592, 568.17; 714/57, 750, 759

(56) References Cited

U.S. PATENT DOCUMENTS

| | | | |
|---|---|---|---|
| 3,786,332 A | 1/1974 | Hepner et al. ............... 318/577 |
| 4,276,698 A | 7/1981 | Dore et al. ............... 33/174 L |
| 4,378,482 A | 3/1983 | Tucker ................. 219/121 EY |
| 4,523,380 A | 6/1985 | Wright .......................... 33/1 M |
| 4,532,402 A | 7/1985 | Overbeck ............. 219/121 LU |
| 4,625,408 A | 12/1986 | Wright .......................... 33/1 M |
| 4,676,649 A | 6/1987 | Phillips ....................... 356/401 |
| 4,724,525 A | 2/1988 | Purcell et al. ............... 364/560 |
| 4,782,598 A | 11/1988 | Guarini ........................ 33/503 |
| 4,789,770 A | 12/1988 | Kasner et al. ............ 219/121.7 |
| 4,820,899 A | 4/1989 | Hikima et al. ......... 219/121.76 |
| 4,873,417 A | 10/1989 | Moriyasu et al. ........ 219/121.6 |
| 4,877,939 A | 10/1989 | Duley et al. ........... 219/121.76 |
| 4,892,407 A | 1/1990 | McMurtry et al. .......... 356/375 |
| 4,939,678 A | 7/1990 | Beckwith, Jr. ......... 364/571.02 |
| 4,941,082 A | 7/1990 | Pailthorp et al. ....... 364/167.01 |
| 5,056,921 A | 10/1991 | Chaney ....................... 356/351 |
| 5,105,552 A | 4/1992 | Bielle .......................... 33/573 |
| 5,114,234 A | 5/1992 | Otsuka et al. ............... 356/358 |
| 5,255,199 A | * 10/1993 | Markman et al. ........... 700/193 |
| 5,280,677 A | 1/1994 | Kubo et al. .................... 33/568 |
| 5,290,992 A | 3/1994 | Lin et al. ............... 219/121.74 |
| 5,315,526 A | * 5/1994 | Maeda et al. ............... 700/204 |
| 5,408,318 A | 4/1995 | Slater .......................... 356/351 |
| 5,552,888 A | 9/1996 | Sogard et al. ............... 356/358 |
| 5,579,246 A | 11/1996 | Ebersbach et al. ..... 364/571.01 |
| 5,594,668 A | 1/1997 | Bernhardt et al. ..... 364/571.07 |
| 5,686,991 A | 11/1997 | Yamazaki ................... 356/358 |
| 5,699,621 A | 12/1997 | Trumper et al. ............. 33/1 M |
| 5,751,585 A | * 5/1998 | Cutler et al. ................ 700/169 |
| 5,777,899 A | 7/1998 | Kumagai ............... 364/571.02 |
| 5,798,195 A | * 8/1998 | Nishi ........................... 430/22 |
| 5,798,927 A | 8/1998 | Cutler et al. ............. 364/474.3 |
| 5,812,420 A | 9/1998 | Takahashi ................... 364/508 |
| 5,832,416 A | 11/1998 | Anderson ..................... 702/95 |
| 5,841,099 A | 11/1998 | Owen et al. ........... 219/121.69 |
| 5,847,960 A | * 12/1998 | Cutler et al. ................ 700/192 |

FOREIGN PATENT DOCUMENTS

JP 1-266983 10/1989

OTHER PUBLICATIONS

International Search Report for PCT/US01/00484, dated Apr. 23, 2001.

* cited by examiner

Primary Examiner—Ramesh Patel
(74) Attorney, Agent, or Firm—Stoel Rives LLP

(57) ABSTRACT

The present invention preferably employs non-contact, small-displacement, capacitive sensors to determine Abbe errors due to the pitch, yaw, or roll of a near linear mechanical stage that are not indicated by an on-axis position indicator, such as a linear scale encoder or laser interferometer. The system is calibrated against a precise reference standard so the corrections depend only on sensing small changes in the sensor readings and not on absolute accuracy of the sensor readings. Although the present invention is preferred for use in split-axis positioning systems with inertially separated stages, the invention can be employed in typical split-axis or stacked stage systems to reduce their manufacturing costs.

56 Claims, 8 Drawing Sheets

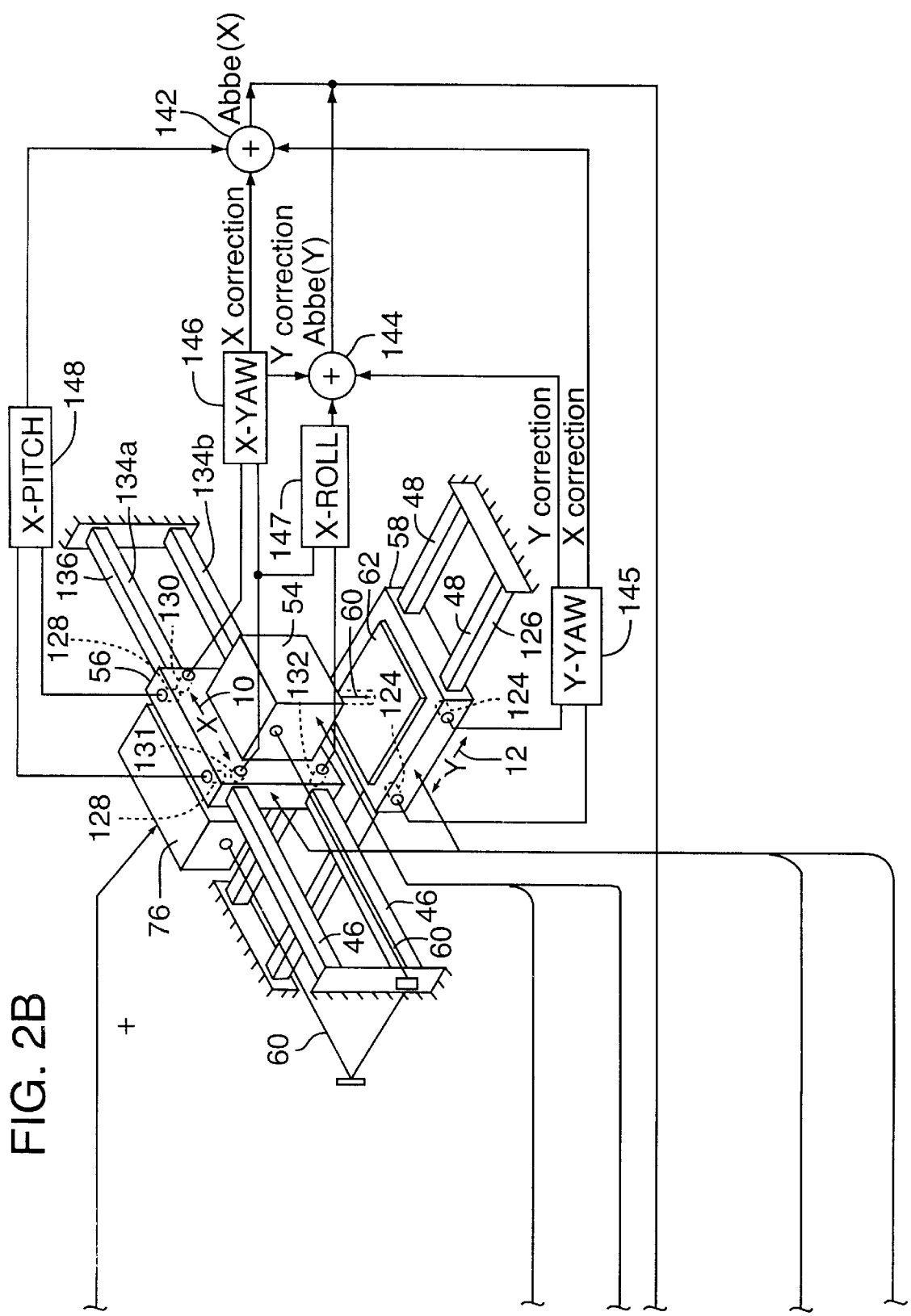

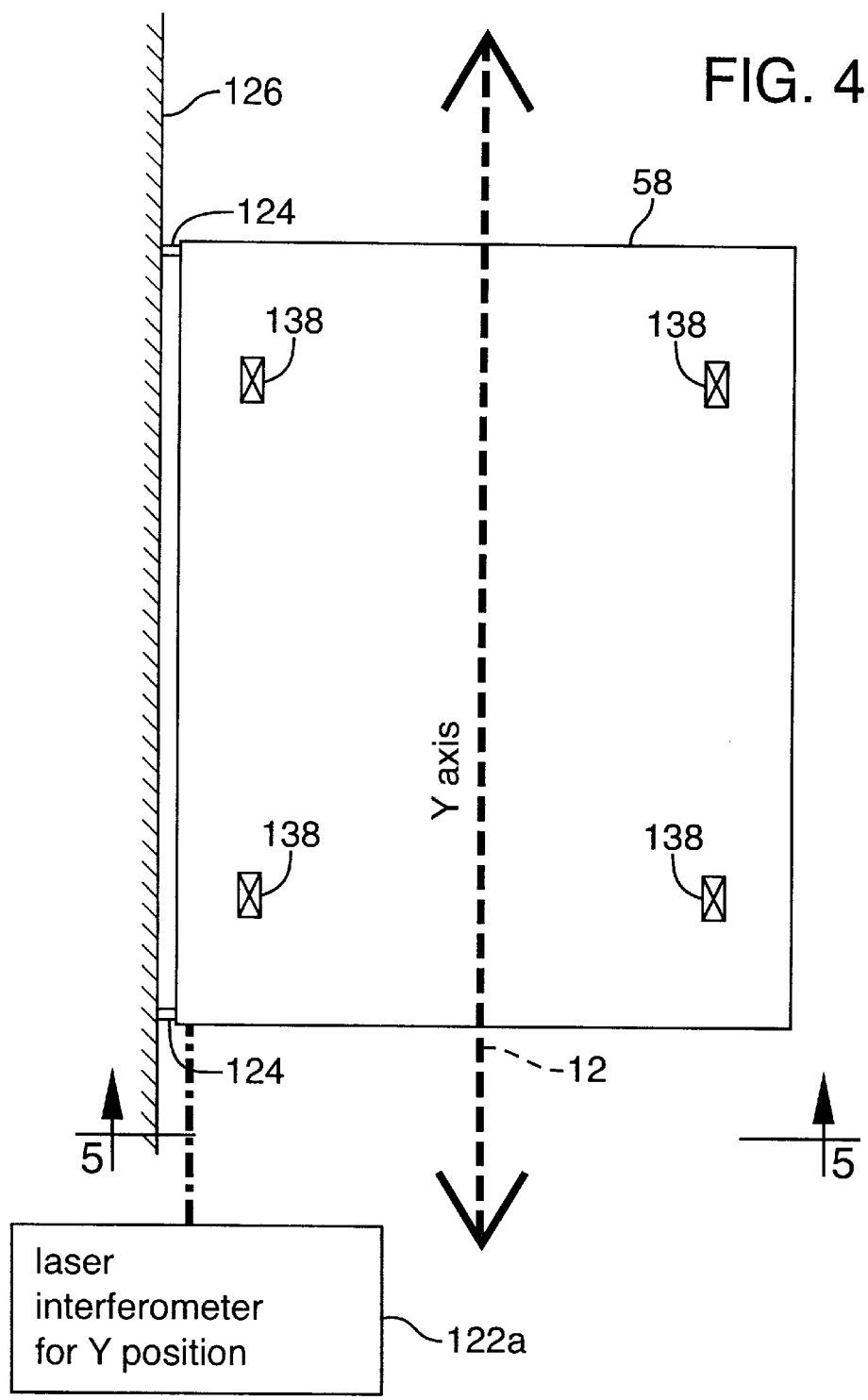
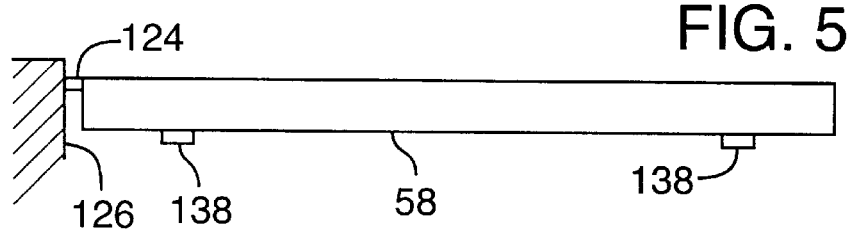

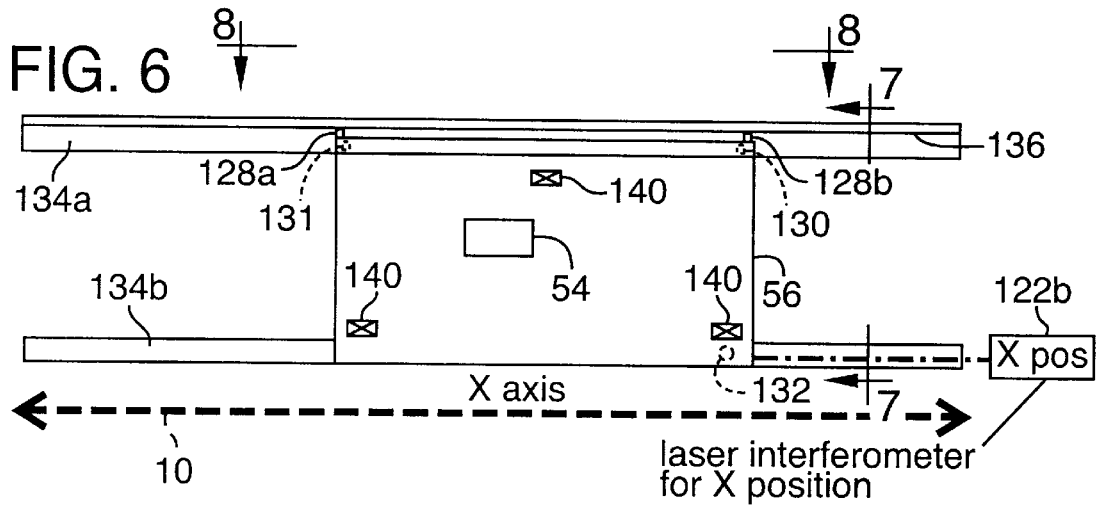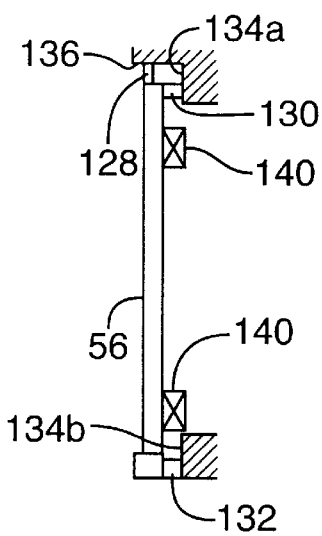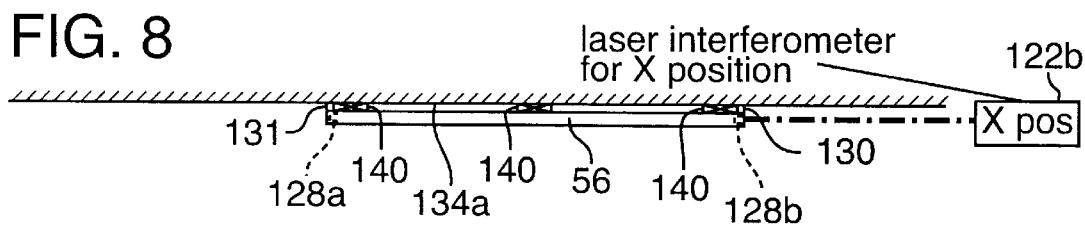

ABBE ERROR CORRECTION SYSTEM AND METHOD

RELATED APPLICATION

This application derives priority from U.S. Provisional Patent Application No. 60/175,993, filed Jan. 11, 2000.

TECHNICAL FIELD

This invention relates to systems or methods for positioning one or multiple "tools," such as laser beams or other radiation beams, relative to target locations on one or multiple workpieces and, in particular, to a system that accurately compensates for Abbe errors associated with the movement of one or more stages of such a beam positioning system.

BACKGROUND OF THE INVENTION

A variety of technologies employ tools to micro-machine, or deposit patterns or materials on target locations on a workpiece. For example, a micro-dimensioned punch may be used to punch holes in a thin metal plate; a laser may be used to precisely machine or selectively erode metallic, crystalline, or amorphous specimens; and ion beams may be used to selectively implant charged particles into an integrated circuit. All of the above-mentioned processes share a common requirement for accurately and rapidly positioning a pertinent tool to target locations on the workpiece.

The following background is presented herein only by way of example to laser beam positioning systems, but skilled persons will appreciate that the description is applicable to tool positioning systems in general. Conventional tool positioning systems, and particularly beam-positioning systems, typically provide movement within a three-dimensional coordinate system and can be characterized in several ways.

Traditional positioning systems are characterized by X-Y translation tables in which the workpiece is secured to an upper stage that is supported by a lower stage. Such systems typically move the workpiece relative to a fixed beam position and are commonly referred to as stacked stage positioning systems because the lower stage supports the inertial mass of the upper stage and the workpiece. These positioning systems have relatively good positioning accuracy because interferometers are typically used along each axis to determine the absolute position of each stage.

In U.S. Pat. No. 4,532,402 of Overbeck, a high-speed short-movement positioner ("fast positioner"), such as a galvanometer, is supported by the upper stage of an X-Y translation table ("slow positioner") and the upper stage and the workpiece are supported by the lower stage. The combined movement of the two positioners entails first moving the slow positioner to a known location near a target location on the workpiece, stopping the slow positioner, moving the fast positioner to the exact target location, stopping the fast positioner, causing the tool to operate on the target location, and then repeating the process for the next target location.

However, the combined system of Overbeck is also a stacked stage positioning system and suffers from many of the same serious drawbacks as the aforementioned fixed beam system. The starting, stopping, and change of direction delays associated with the inertial mass of the stages and fast positioner unduly increase the time required for the tool to process the workpiece. Overbeck's system also imposes a serious drawback upon a computer-based machine tool control file or "database" that typically commands the tool to move to a series of predetermined target locations across the workpiece. The database positioning the tool across the workpiece must be "panelized" into abutting segments that each fit within the limited movement range of the fast positioner when the size of large circuit patterns exceeds this movement range.

U.S. Pat. Nos. 5,751,585 and 5,847,960 of Cutler et al. describe split-axis positioning systems, in which the upper stage is not supported by, and moves independently from, the lower stage and in which the workpiece is carried on one axis or stage while the tool is carried on the other axis or stage. These positioning systems have one or more upper stages, which each support a fast positioner, and can process one or multiple workpieces simultaneously at high throughput rates because the independently supported stages each carry less inertial mass and can accelerate, decelerate, or change direction more quickly than can those of a stacked stage system. Thus, because the mass of one stage is not carried on the other stage, the resonance frequencies for a given load are increased. Furthermore, the slow and fast positioners are adapted to move, without necessarily stopping, in response to a stream of positioning command data while coordinating their individually moving positions to produce temporarily stationary tool positions over target locations defined by the database. These split-axis, multirate positioning systems reduce the fast positioner movement range limitations of prior systems while providing significantly increased tool processing throughput and can work from panelized or unpanelized databases.

Such split-axis positioning systems are becoming even more advantageous as the overall size and weight of the workpieces increase, utilizing longer and hence more massive stages. At the same time, feature sizes are continuing to decrease, causing the need for dimensional precision to increase, and split-axis systems are more likely to exhibit rotational errors that introduce Abbe errors, which are errors indicative of the physical separation between the effective position of a stage and the indicated position of the stage. Abbe errors are typically caused by imperfections or thermal variations in the bearings upon which the stages slide and/or alignment or acceleration imperfections of the drive mechanisms that provide movement to the stages.

FIG. 1 shows three mutually perpendicular translational motion axes, such as X axis 10, Y axis 12, and Z axis 14 that define a three-dimensional coordinate system 16, and three mutually perpendicular rotational motion axes (hereafter referred to as a roll axis 18, a pitch axis 20, and a yaw axis 22). Skilled workers typically refer to roll as an angular rotation about X-axis 10, pitch as an angular rotation about Y-axis 12, and yaw as an angular rotation about Z-axis 14.

Although laser interferometer systems can be used to indicate and compensate for certain Abbe errors, such systems are costly and heavy because they typically require reference mirrors that are nearly as long as the combined stage length plus the length of travel, e.g. as much as two times the travel distance. Such mirrors are difficult, if not impossible, to procure for the long travel dimensions of large stages, such as with a lengthwise dimension of 76 to 92 cm (30–36 inches), needed to accommodate larger workpieces. Furthermore, split-axis systems would require at least two interferometers for each stage and/or a very complex system of optics to indicate angle and position, and the additive weight of the interferometers would increase the inertial load on the stages at the expense of frequency response time to changes in momentum.

U.S. Pat. No. 5,699,621 of Trumper et al. discloses the use of small range displacement transducers to indicate pitch, yaw, and roll angle errors. Trumper et al. correct angular errors by controlling the bearing gap with electromagnets that require the use of a highly compliant magnetic or air bearing system. The correction speed of the Trumper et al. system is limited to the bandwidth of the linear stage system and therefore has similar mass versus bandwidth limitations as stacked stage positioning systems.

A less expensive and/or less massive and very accurate Abbe error correction system or method is therefore desirable.

SUMMARY OF THE INVENTION

An object of the present invention is to provide a method or apparatus that employs non-contact small displacement sensors, such as capacitive sensors, to determine Abbe errors due to mechanical stage pitch, yaw and roll that are not indicated by an on-axis position indicator, such as a linear scale encoder or laser interferometer, and a means to compensate for such Abbe errors.

Another object of the invention is to employ such sensors to determine and correct Abbe errors due to linear bearing variability or distortions associated with acceleration or temperature gradients.

The present invention provides a cost effective means to determine and compensate for linear stage positioning system Abbe errors that are errors at the effective position of the system that are not indicated by a position indicator such as a metal or glass scale encoder or laser interferometer due to pitch, yaw, or roll of the linear stage and the resulting physical distance between the effective position and the indicated position of a stage. To minimize cost, the system is calibrated against precision X and Y position reference standards so the corrections depend only on sensing small changes in the sensor readings and not on absolute accuracy of the sensor readings. Although the present invention is preferred for use in split-axis positioning systems, it can be employed in stacked stage systems to reduce their manufacturing costs. Although a linear scale encoder can be employed to indicate the nominal on-axis stage position to reduce costs further, a laser interferometer can be used when a greater level of accuracy and/or resolution is desired.

Additional objects and advantages of this invention will be apparent from the following detailed description of preferred embodiments thereof which proceeds with reference to the accompanying drawings.

BRIEF DESCRIPTION OF THE DRAWINGS

FIGS. 2A and 2B provide a pictorial block diagram of a multi-stage laser beam positioning system of this invention.

FIG. 4 is a plan view showing preferred positions of Y-stage Abbe error sensors mounted on a Y-axis stage (workpiece stage) relative to a reference surface.

FIG. 5 is an end view showing preferred positions of the sensors mounted on the Y-axis stage of FIG. 4.

FIG. 6 is a side elevation view showing preferred positions of X-stage Abbe error sensors mounted on an X-axis stage (tool stage) relative to a reference surface.

FIG. 7 is an end view showing preferred positions of the sensors mounted on the X-axis stage of FIG. 6.

FIG. 8 is a plan view showing preferred positions of the sensors mounted on the X-axis stage of FIG. 6.

DETAILED DESCRIPTION OF PREFERRED EMBODIMENT

Figure 2A:
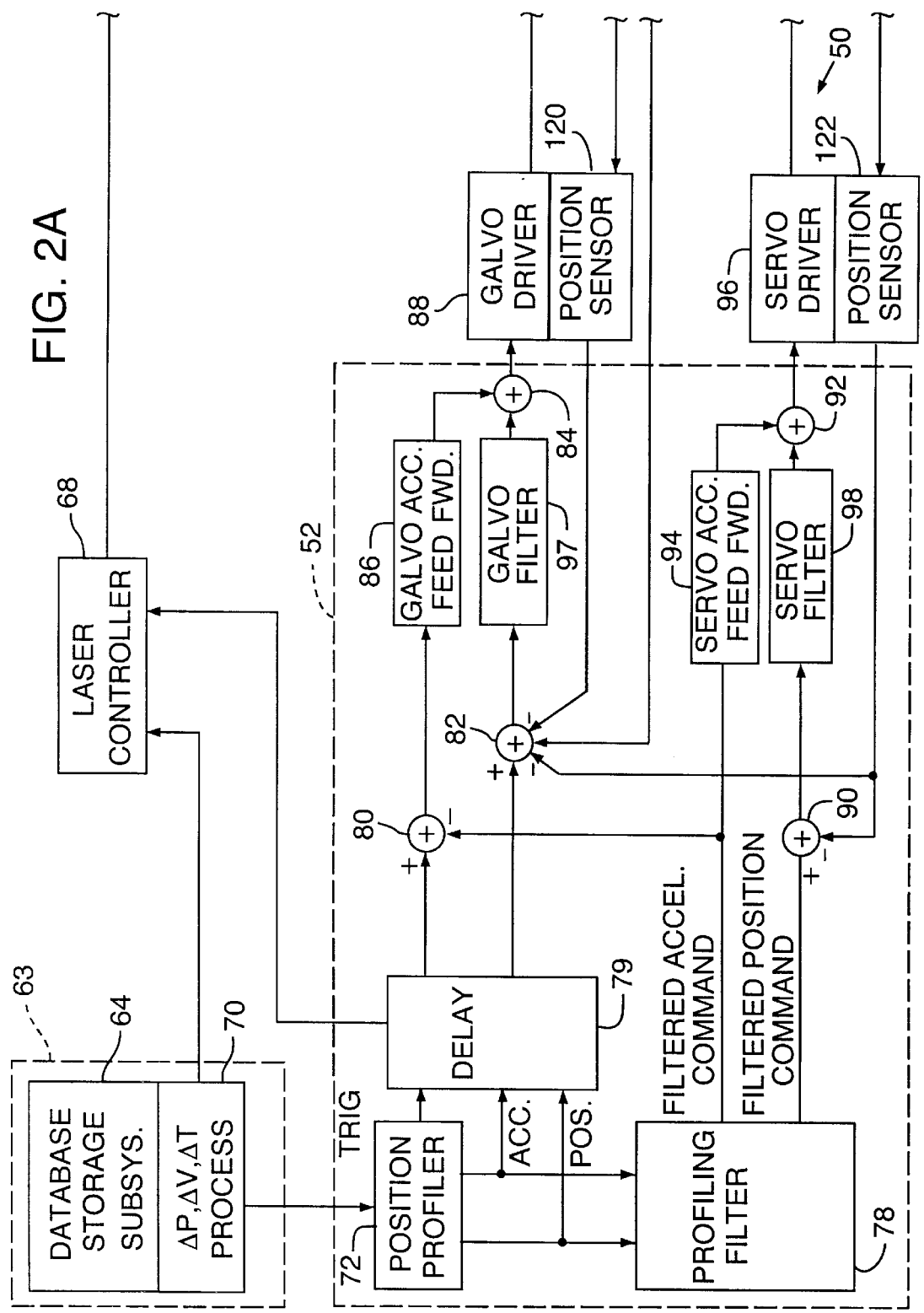

FIGS. 2A and 2B (generically FIG. 2) show a multi-stage tool positioner system 50 having positioning command execution capabilities in accordance with this invention. Positioner system 50 is described herein only by way of example with reference to a single-head, laser-based hole cutting system that employs a digital signal processor ("DSP") 52 to control a fast galvanometer positioner stage 54 (scanner or "fast stage 54"), a slow X-axis translation stage 56 ("slow stage 56"), and a slow Y-axis translation stage 58 ("slow stage 58") to direct a laser beam 60 to target locations on a single workpiece 62, such as an etched circuit board.

With reference to FIG. 2, in a preferred split-axis embodiment, the X-axis translation stage 56 is supported by bearings on rails 46 and generally moves along an X-Z plane, and the Y-axis translation stage 58 is supported by bearings on rails 48 and generally moves along an X-Y plane. Skilled persons will appreciate that both stages 56 and 58 could alternatively be adapted to move in parallel planes and be inertially separated or dependent. In a preferred embodiment, positioner system 50 employs high stiffness re-circulating or cross-roller bearing systems to support and direct the movement of stages 56 and 58.

A system control computer 63 processes a tool path database stored in a database storage subsystem 64. The database contains the desired processing parameters for cutting holes and/or profiles with laser beam 60 in workpiece 62. The database is conventionally compiled using a tool path generating program, such as I-DEAS Generative Machining provided by Structural Dynamics Research Corporation located in Milford, Ohio. System control computer 63 conveys parsed portions of the stored database to a laser controller 68 and position control portions of the database as a data stream to a delta process 70. Delta process 70 resolves the data stream into x and y components for delta position ("dp"), delta velocity ("dv"), and delta time ("dt") for each intended change in the path of laser beam 60 across workpiece 62. Consequently, each movement of laser beam 60 is defined in dp, dv, and dt components that are further processed by a position profiler 72 into move profiles including acceleration and/or constant velocity segment position signals.

Delta process 70 preferably generates the dp, dv, and dt components in accordance with a preferred BASIC language signal processing procedure described in U.S. Pat. Nos. 5,751,585 and 5,847,960 of Cutler et al., which are assigned to the assignee of this application.

Referring again to FIG. 2, the dp, dv, and dt components generated by delta process 70 are further processed by position profiler 72 into the move profile positioning signals required to move fast stage 54 and slow stages 56 and 58 as commanded by the database. Ideally, positioner acceleration is proportional to motive force, and motive force is proportional to electrical current supplied to a positioner driver such as a linear or rotary servo motor or a galvanometer coil. Therefore, the positioning signal produced by position profiler 72 is a series of "full-spectrum" half-sine profiled acceleration-inducing and constant velocity-inducing positioning steps that cause system movements. The full-spectrum bandwidth need only be about 250 Hertz, a bandwidth sufficient to drive a typical galvanometer-driven mirror positioner at its maximum frequency.

Instantaneous values of the full-spectrum positioning signal are generated by DSP 52 at a rate of about 10,000 points per second by employing the dp, dv, and dt components generated by delta process 70 as variables for a sine value generation program running in DSP 52. Alternatively, the dp, dv, and dt components may be employed to address and fetch associated sinusoidal waveform values stored in a sine value lookup table that is incorporated within DSP 52.

The resulting full-spectrum positioning signal has acceleration and position components that are received by a profiling filter 78 having a constant signal propagation delay and a delay element 79 that compensates in DSP 52 for the constant signal propagation delay of profiling filter 78. For example, delay element 79 delays the laser triggering pulses generated by position profiler 72 to coincide with the delayed movements of fast stage 54 and slow stages 56 and 58. Profiling filter 78 and delay element 79 also cooperate, as described below, to move slow stages 56 and 58 smoothly over the average position profile while limiting their acceleration to ±1 g and cooperate to limit fast stage 54 positioning movements to ±10 millimeters.

The position component is received by profiling filter 78 to produce filtered position command data for driving slow stages 56 and 58. Profiling filter 78 is preferably a fourth-order low-pass filter.

Because profiling filter 78 produces filtered position command data having a constant time delay with respect to the half-sine positioning signal position component, the constant time delay is compensated for by delay element 79. Delay element 79 is preferably implemented in DSP 52 as a programmed delay in conveying the half-sine positioning signal acceleration and position components from position profiler 72 to fast stage 54 signal processing elements, the first of which are adders 80 and 82. Thereby, half-sine positioning signals directed to fast stage 54 are time synchronized with the filtered position commands directed to slow stages 56 and 58.

The acceleration component from position profiler 72 is also filtered by profiling filter 78 to provide a filtered acceleration command to adder 80 and a feed forward process 94. Adder 80 functions as a high-pass filter by subtracting the filtered acceleration command from the acceleration component of the full-spectrum positioning signal to form a galvo acceleration feed forward signal, which is conveyed to a feed forward process 86. Likewise, the filtered position command from profiling filter 78 and the delayed position component of the half-sine positioning signal are conveyed respectively to adders 90 and 82 for processing and distribution, respectively, to slow stages 56 and 58 and fast stage 54. A galvo filter 97 and a servo filter 98 are conventional loop compensation filters that function to keep fast stage 54 and slow stages 56 and 58 stable.

Profiling filter 78 is implemented by cascading two or more second-order filters having critical damping ratios. As the number of cascaded filters increases beyond two, their cutoff frequencies increase by about the square root of the number of filters (e.g., two filters have cutoffs that are 1.414 times the cutoff for a single filter). Preferably two filters are cascaded to provide good smoothing while keeping the overall filter implementation simple.

For profiling filter 78, the preferred 38 radian per second cutoff frequency (about 6 Hertz (Hz)) is a very low frequency compared to the 10 kHz rate at which DSP 52 updates positioning data for slow stages 56 and 58. If profiling filter 78 runs at the 10 kHz slow stage update frequency, the discrete filter coefficients become sensitive to roundoff errors because the poles of the discrete filter move close to the unit circle. Profiling filter 78 also receives the acceleration command from position profiler 72 and generates the filtered acceleration command that is conveyed to servo feed forward process 94 and to adder 80.

The desired move profile commands are preferably calculated at the 10 kHz updating rate, and the slow stage acceleration and actual (not commanded) position is subtracted therefrom at adders 80 and 82 to produce, respectively, the fast stage acceleration and position command signals.

The fast stage acceleration command signal is processed through adder 80 and feed forward process 86, while the fast stage position command signal is processed through adder 82 and galvo filter 97. The processed fast stage signals are combined in an adder 84 and conveyed to a galvanometer driver 88.

Likewise, the slow stage filtered acceleration command is processed through a feed forward process 94, while the slow stage filtered position command is processed through adder 90 and servo filter 98. The processed slow stage signals are combined in an adder 92 and conveyed to a linear servo motor driver 96.

Galvanometer driver 88 provides deflection control current to a pair of mirror deflecting galvanometers in fast stage 54, and servo motor driver 96 provides control current to linear servo motors that control the positioning of slow stages 56 and 58.

Figure 1:
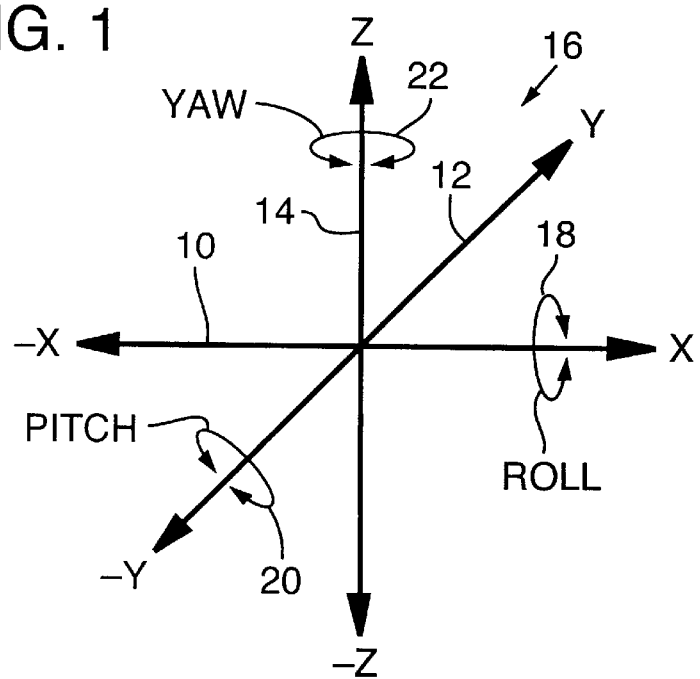
FIG. 1 shows six axes, including three mutually perpendicular translational motion axes, X, Y, and Z, and three mutually perpendicular rotational motion axes, roll, pitch, and yaw.
Figure 3:
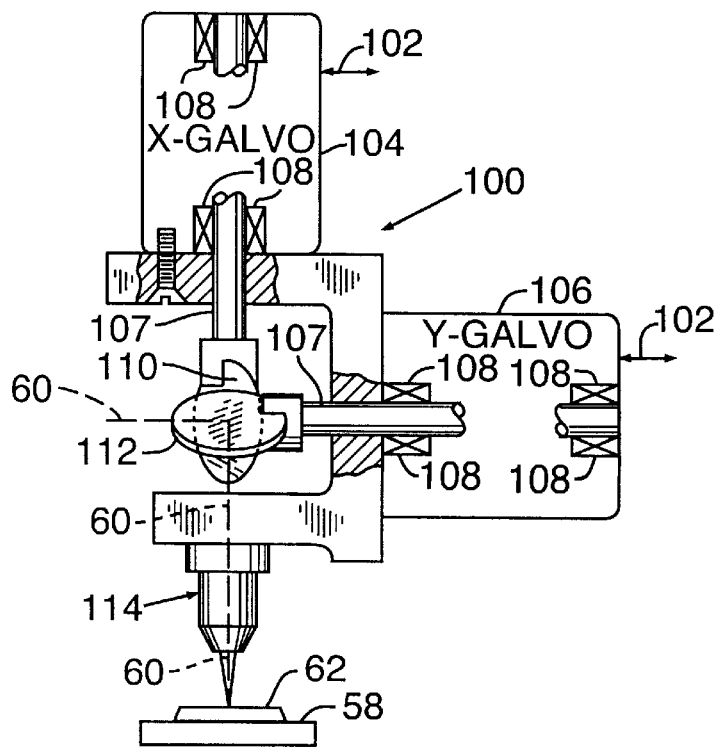
FIG. 3 is a fragmentary pictorial side view showing a prior art galvanometer driven mirror positioner of a type suitable for use with this invention.

FIG. 3 shows a prior art galvanometer-driven mirror positioner 100 of a type suitable for use as fast stage 54. Galvanometer driver 88 (FIG. 2) provides rotational control current on conductors 102 to respective X-axis and Y-axis high-speed response D.C. motors 104 and 106 that rotate shafts 107 in bearings 108 to selectively pivot a pair of mirrors 110 and 112 that deflect laser beam 60 through an optional lens 114 to a predetermined target location on workpiece 62.

Alternatively, a nonbearing motion positioner, such as a piezoelectric element, a voice coil actuator, or other limited angle high-speed positioner device could be used in place of galvanometer-driven mirror positioner 100 in positioner system 50.

Likewise with reference to FIG. 2, alternative accurate rotary or linear positioner mechanisms may be substituted for the linear servo motors driving slow stages 56 and 58. However, in positioner system 50, linear motors that preferentially respond to the slow stage position command are preferred.

Two signals are combined with the slow and fast stage position commands to reduce positional errors between the commanded position and the actual position of laser beam 60 on workpiece 62. The delayed fast stage position command at adder 82 and the filtered slow stage position command at adder 90 represent the ideal signal values required to cause proper positioning of stages 54, 56, and 58. However, practical factors such as gravity, friction, mass, and inaccuracies in the full-spectrum positioning signal generated by position profiler 72 are not contemplated in the unmodified position commands.

The practical factors are accounted for by sensing the actual positions of stages 54, 56, and 58 with position sensors 120 and 122 to provide predictive position feedback data to adders 82 and 90 in DSP 52. Note that adder 82 in the fast stage positioning path receives position feedback data from both position sensors 120 and 122. Position sensors 120 and 122 may be well-known types employing rotating capacitor plates, linear and rotary encoder scales, or interferometer motion detectors together with appropriate analog-to-digital and/or digital-to-analog conversion techniques.

As laser beam 60 undergoes movement across workpiece 62, the sensed beam position is continuously compared to the commanded beam position, with the positional difference representing a degree to which the practical factors have caused positioning errors. In particular, sensed position data of fast stage 54 and slow stages 56 and 58 are generated by position sensors 120 and 122 and subtracted from the commanded position at adder 82 to generate positional difference data that are combined in adder 84 with acceleration data from feed forward process 86. Likewise, sensed position data of slow stages 56 and 58 are generated by position sensor 122 and subtracted from the commanded position at adder 90 to generate positional difference data that are combined in adder 92 with acceleration data from feed forward process 94.

Coordinated positioning is particularly beneficial for applications such as laser beam hole cutting that requires rapid movement between target locations along a tool path combined with pauses at each target location to fire the laser to cut a hole but, of course, is not limited to that application. Other features and preferred processing parameters of a conventional laser drilling system are disclosed in U.S. Pat. No. 5,841,099 of Owen et al.

FIGS. 4 and 5 are respective plan and end views showing preferred positions of Y-stage Abbe sensors 124 mounted on Y-axis translation stage 58 relative to yaw reference surface 126 in accordance with an aspect of this invention, and FIGS. 6–8 are respective side elevation, end, and plan views showing preferred positions of X-stage Abbe sensors 128, 130, 131, and 132 mounted on X-axis translation stage 56 relative to yaw and roll reference surfaces 134 and pitch reference surface 136 in accordance with an aspect of this invention.

With reference to FIGS. 2B and 4–8, Abbe sensors 124, 128, 130, 131, and 132 are preferably non-contact, small and lightweight displacement sensors. The most preferred sensors measure capacitance as a function of distance from a given reference surface. In a preferred embodiment, the Abbe sensors have a gap range (distance between sensor and reference surface) of 50 μm plus or minus 25 μm and a resolution of less than 50 nm and preferably less than or equal to 10 nm. Skilled persons will appreciated that numerous other ranges are possible including a wider or narrower gap range and better resolution when the technology becomes cost effective. Non contact sensors are preferred because they eliminate wear that might lead to inaccuracies. Preferred Abbe sensors include Model PX405H series probes available from Lion Precision of St. Paul, Minn. Other suitable capacitance probes or sensors are available from ADE Technologies of Westwood, Mass. and Micro-Epsilon of Ortenburg, Germany.

Reference surfaces 126, 134, and 136 may be formed on appropriate sides of bearing rails 46 and 48 as shown in FIG. 2B or may be otherwise positioned near but separated from translations stages 56 and 58 as shown in FIGS. 4–8. (In FIGS. 4–8, four Y-stage bearings 138 and three X-stage bearings 140 are depicted instead of rails 46 and 48). The reference surfaces are preferably the same length as the base for the stages or at least as long as the movement ranges along bearing rails 46 and 48. The reference surfaces are preferably stable but do not need to be perfectly straight because the sensors are calibrated against the entire length of the surfaces so the corrections depend only on sensing small changes in the sensor readings and not on absolute accuracy of the sensor readings or stage positions.

Although stages 56 and 58 could be adapted to move in parallel planes and be inertially separated or dependent, the following description is, for convenience, presented herein only by way of example to addressing X and Y axis position errors in split-axis positioning system 70 where substantially flat (100 to 10,000 times larger in the X and Y dimensions than in Z dimension) workpiece 62 is carried on Y stage 58 and the tool (laser 76) is directed by X-stage 56.

With reference again to FIGS. 2A, 2B, 4 and 5, the nominal on-axis position of Y stage 58 is indicated by sensor 122a, which is preferably a glass or metal scale encoder or a laser interferometer depending on desired positioning accuracy specifications. In a split-axis configuration, Y-stage yaw typically produces the most significant X and Y Abbe errors. The yaw error is indicated by preferably a pair of Y-stage Abbe sensors 124a and 124b (generically sensors 124) that are preferably mounted as far apart as possible along Y axis 12 and as near to the top of the side of Y stage 58, or a chuck that it may support, as practical. Reference surface 126 is preferably integrated into rail 46 or the base of the Y stage assembly in a manner that results in as stable an indication of the stage yaw as possible as a function of other effects including bearing repeatability, temperature, and stage acceleration.

The capacitances indicating the X components of the distance from the reference surface of the Abbe error detected by sensors 124 due to yaw are preferably converted by a Y-stage yaw probe driver 145 into a DC voltage suitable for processing into Abbe error correction signals. These signals may be directed to separate X-Abbe and Y-Abbe error adders 142 and 144 before being routed to adder 82 and incorporated into scanner position commands.

With reference again to FIGS. 2A, 2B, and 6–8, pitch, yaw, and roll of X stage 56 can also cause significant X and Y position errors. The preferred split-axis configuration, as shown in the figures, has X stage 56 oriented on edge, such that the planes defined by the stages 56 and 58 are transverse and such that stages 56 and 58 are inertially separated. In a most preferred embodiment, X stage 56 is oriented vertically while Y stage 58 is oriented horizontally. Thus, pitch, yaw, and roll in this context are defined with respect to the actual plane of movement of X stage 56 and not with respect to a more typical horizontal orientation.

The nominal on-axis position of X stage 56 is indicated by sensor 122b, which is preferably a glass or metal scale encoder or a laser interferometer depending on desired positioning accuracy specifications. The X-stage Abbe sensors 128, 130, 131, and 132 may all be the same types as or different types from Y-stage sensors 124. Sensors 128a and 128b (generically sensors 128) are preferably mounted as far apart as possible along X axis 10. Similarly, sensors 130 and 131 are preferably mounted as far apart as possible along X axis 10. Sensor 132 is preferably mounted to be planar with and as far apart as possible along Z axis 14 from sensor 131.

Because X stage 56 is preferably kinematically mounted on three bearings 140 as shown in FIGS. 6–8, changes in distance from reference surfaces 134 and 136 detected by X-stage Abbe sensors 128, 130, 131, and 132 will result predominately in movement of a plane associated with X stage 56 and not from distortion of X stage 56. X-stage Abbe sensors 130 and 131 detect distances from X-stage yaw reference surface 134*a* and indicate changes in the yaw angle of the plane of X stage 56. X-stage Abbe sensors 131 and 132 detect distances from X-stage role reference surfaces 134*a* and 134*b,* respectively, and indicate changes in the roll angle of the plane of X-stage 56. X-stage Abbe sensors 128 detect distances from the pitch reference surface 136 and indicate changes in the pitch angle of X stage 56.

The capacitances indicating the X and Y components of the distance from the reference surface 134*a* of the Abbe error detected by sensors 130 and 131 due to yaw are preferably converted by an X-stage yaw probe driver 146 into a DC voltage suitable for processing into Abbe error correction signals. Similarly, the capacitances indicating the X and Y components of the distances from the reference surfaces 134*a* and 134*b* of the Abbe error detected by sensors 131 and 132 due to roll are preferably converted by an X-stage roll probe driver 147 into a DC voltage suitable for processing into error correction signals. Similarly, the capacitances indicating the X and Y components of the distances from the reference surface 136 of the Abbe error detected by sensors 128 due to pitch are preferably converted by an X-stage pitch probe driver 148 into a DC voltage suitable for processing into error correction signals. Skilled persons will note that sensor 131 feeds both yaw probe driver 145 and roll probe driver 146. Suitable probe drivers are well known to skilled persons; however, the Compact Probe Driver manufactured by Lion Precision is preferred. These yaw, roll, and pitch Abbe error correction signals may be directed to separate X-Abbe and Y-Abbe adders 142 and 144 before being routed to adder 82 and incorporated into scanner position commands.

The X and Y position components that correspond to these Abbe errors are calculated in real time as positioner system 50 moves and process workpiece 62 and are added to or superimposed on the scanner position commands to compensate for the Abbe position errors. These angular changes are combined with the geometry of the optics (including location of the beam path (or beam paths) relative to the stage and distance of the work from the stage) to indicate associated changes (errors) in effective beam position on the work. Fast response is achieved by adding the Abbe error corrections to the scanner position at adder 82 because the bandwidth of the fast stage 54 is significantly higher than the bandwidth of the linear stages 56 and 58.

However, the Abbe error corrections resulting from the system of sensors could be added to the linear stage position servo loop directly at adder 90. This implementation would be appropriate when fast stage 54 is replaced by a fixed beam positioner. A fixed beam positioner would typically provide more precise beam positioning than is provided by fast stage 54 and would be employed in applications where greater accuracy might be desirable such as in severing micron or submicron sized links. Skilled persons will appreciate that X-axis stage 56 could be adapted so that fast stage 54 may be interchangeable with a fixed beam positioner, or that X-axis stage 56 may support both fast stage 54 and a fixed beam positioner simultaneously. In the latter case, Abbe error corrections would be fed to adder 82 whenever fast stage 54 is employed and fed to adder 90 whenever a fixed beam positioner is employed.

Figure 9:
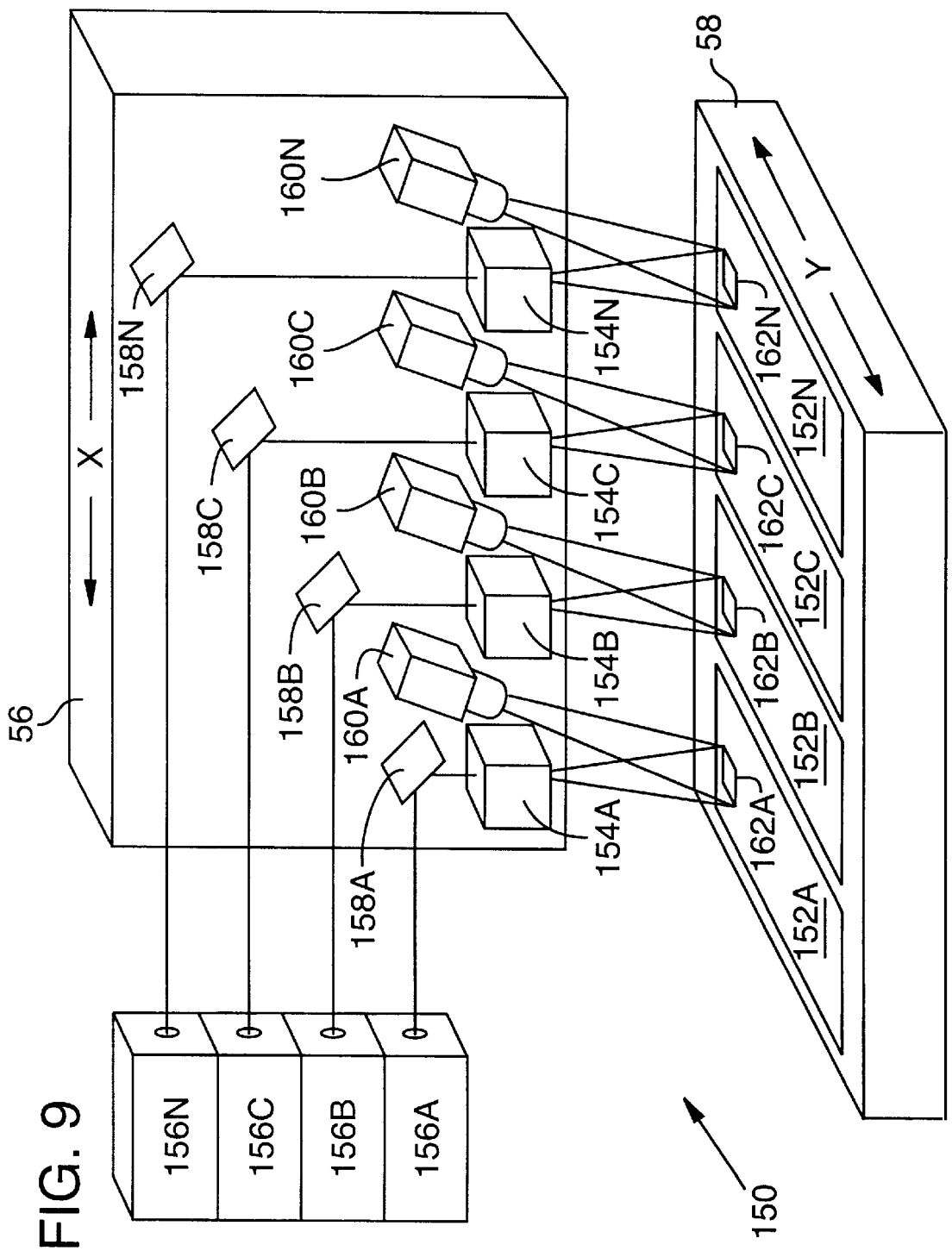
FIG. 9 is an oblique pictorial view showing a multi-head laser machining system employing the present invention.

FIG. 9 shows a multi-head positioner 150 embodiment of this invention in which multiple workpieces 152A, 152B, 152C, . . . 152N are simultaneously processed. (Hereafter multiple elements are referred to collectively without the letter suffix, e.g., "workpieces 152"). Multi-head positioner 150 employs one each of slow stages 56 and 58 configured such that workpieces 152 are fixtured and carried on Yaxis slow stage 58 and multiple fast stages 154A, 154B, 154C, . . . 154N are carried on X-axis slow stage 56. Of course, the roles of slow stages 56 and 58 may be reversed, or two or more fast stages 154 may be carried by one or more X-axis slow stages 56 while Y-axis 58 carries a single workpiece 62.

As the number of fast stages 154 carried on slow stage 56 increases, their accumulated mass becomes increasingly difficult to accelerate. Therefore, the number N of fast stages 154 carried on slow stage 56 is preferably limited to four, although N may vary with positioner types and applications.

Each of workpieces 152 has associated with it one or more processing tools, preferably a laser 156A, 156B, 156C, . . . 156N that directs processing energy toward associated fast stages 154A, 154B, 154C, . . . 154N by way of associated mirrors 158A, 158B, 158C, . . . 158N. Fast stages 154 deflect the processing energy to target locations in substantially square, such as 20 by 20 millimeter processing fields 162A, 162B, 162C, . . . 162N located on associated workpieces 152.

Video cameras 160A, 160B, 160C, . . . 160N are positioned on slow stage 56 for viewing associated processing fields 162, sensing the alignments, offsets, rotations, and dimensional variations of workpieces 152, and aiming and focusing lasers 156.

In the preferred embodiment, the same processing pattern is duplicated on workpieces 152 by each of lasers 156 and fast stages 154. However, in some processing applications, processing pattern variations may be required to match the pattern to variations among workpiece geometries, scale factors, offsets, rotations, distortions. Alternatively, it may be desirable to have one or more lasers 156 simultaneously processing different, but preferably nominally identical or repetitive (slave to a single Y stage), patterns on the same workpiece 152. It may also be necessary to correct for fast stage nonlinearities and mounting inconsistences introduced by mounting position variations among workpieces 152 mounted on slow stage 58. Unlike prior multi-spindle drilling machines, multi-head positioner 150 can compensate for the above-described variations by employing programmable correction factors, described with reference to FIGS. 10 and 11, when driving each of fast stages 154. Similarly, the Abbe errors, indicating the degree to which a commanded tool position does not match a sensed target location, can be compensated for in a manner similar with that described with respect to FIGS. 2A, 2B, and 4–8.

Figure 10:
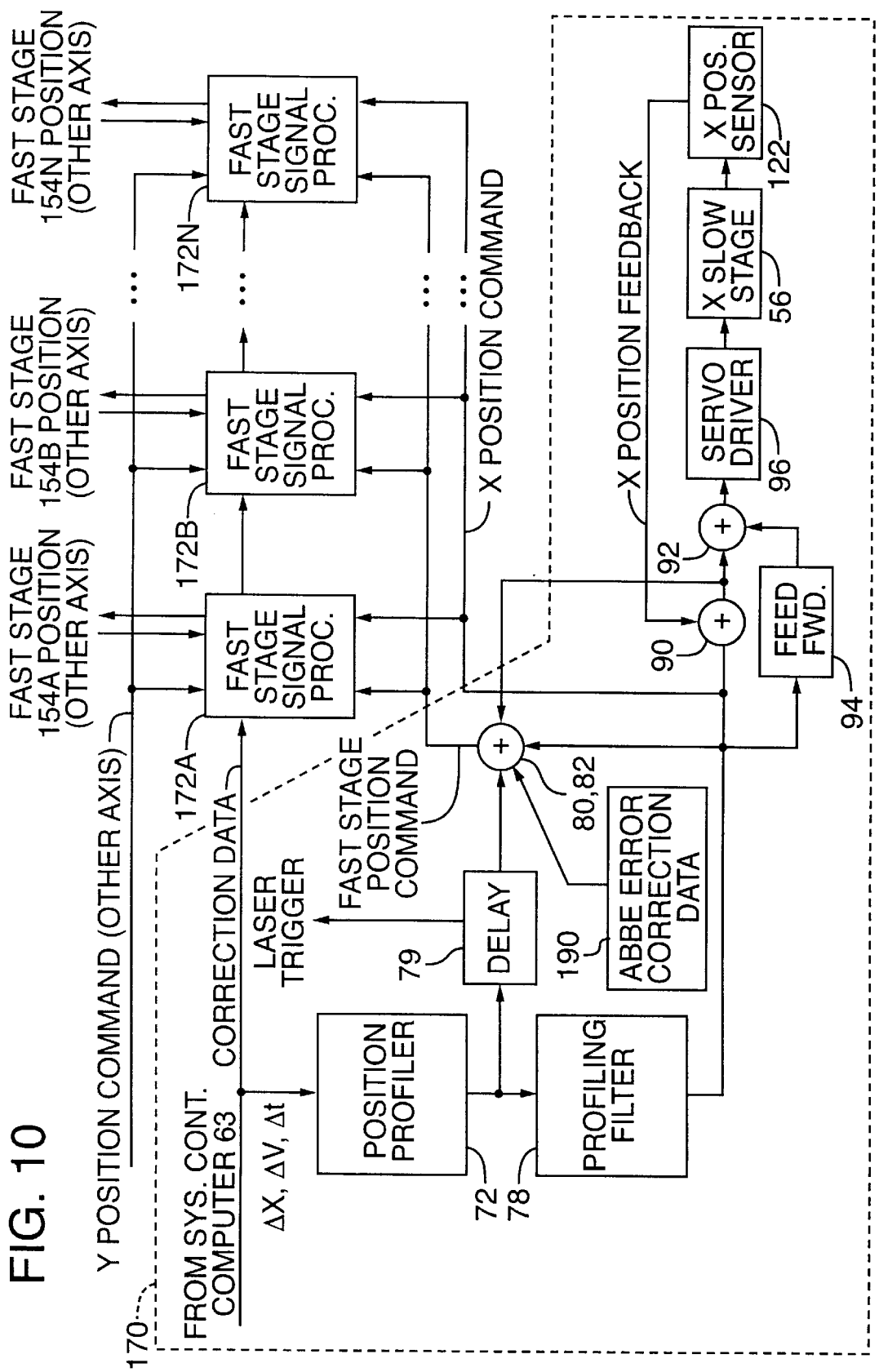
FIG. 10 is a simplified electrical block diagram of a digital signal processing system including multiple fast stage signal processors employed in the multi-head laser machining system of FIG. 9.

FIG. 10 shows how multi-rate positioner DSP 52 (FIG. 2) may be adapted to coordinate the positioning of multiple fast stages 154 and slow stages 56 and 58, resulting in a multi-head DSP 170. In like manner to DSP 52, multi-head DSP 170 receives from system control computer 63 dp, dv, and dt components that are further processed by position profiler 72 into half-sine profiled positioning signals. DSP 170 also includes some of the same signal processing elements as DSP 52, namely profiling filter 78, delay element 79, feed forward process 94, servo driver 96, slow stage 56, and position sensor 122. Because FIG. 10 is simplified, only X-axis slow stage 56 processing elements are shown. Skilled workers will understand that corresponding Y-axis elements are implied.

Only a single system control computer 63 is required to drive slow stages 56 and 58 and N fast stages 154. Multiple fast stage signal processors 172A, 172B, 172C, . . . 172N each receive fast stage correction data from system control computer 63. In this way, fast stage position commands and current slow stage position data are received by each of fast stage signal processors 172 such that each of fast stages 154 is directed to a common set of target locations that are further positionable by unique error correction data. If only a single X-axis stage 56 is employed to carry multiple fast stages 154 and a single Y-axis stage 58 is employed to carry one or multiple workpieces 152, then the Abbe error detection system shown and described in connection with FIGS. 2A, 2B, and 4–8 can be employed without modification, and the Abbe error correction data 190 can be fed to adder 80 of FIG. 10 or fast stage correction processor 180 of FIG. 11 as shown.

Figure 11:
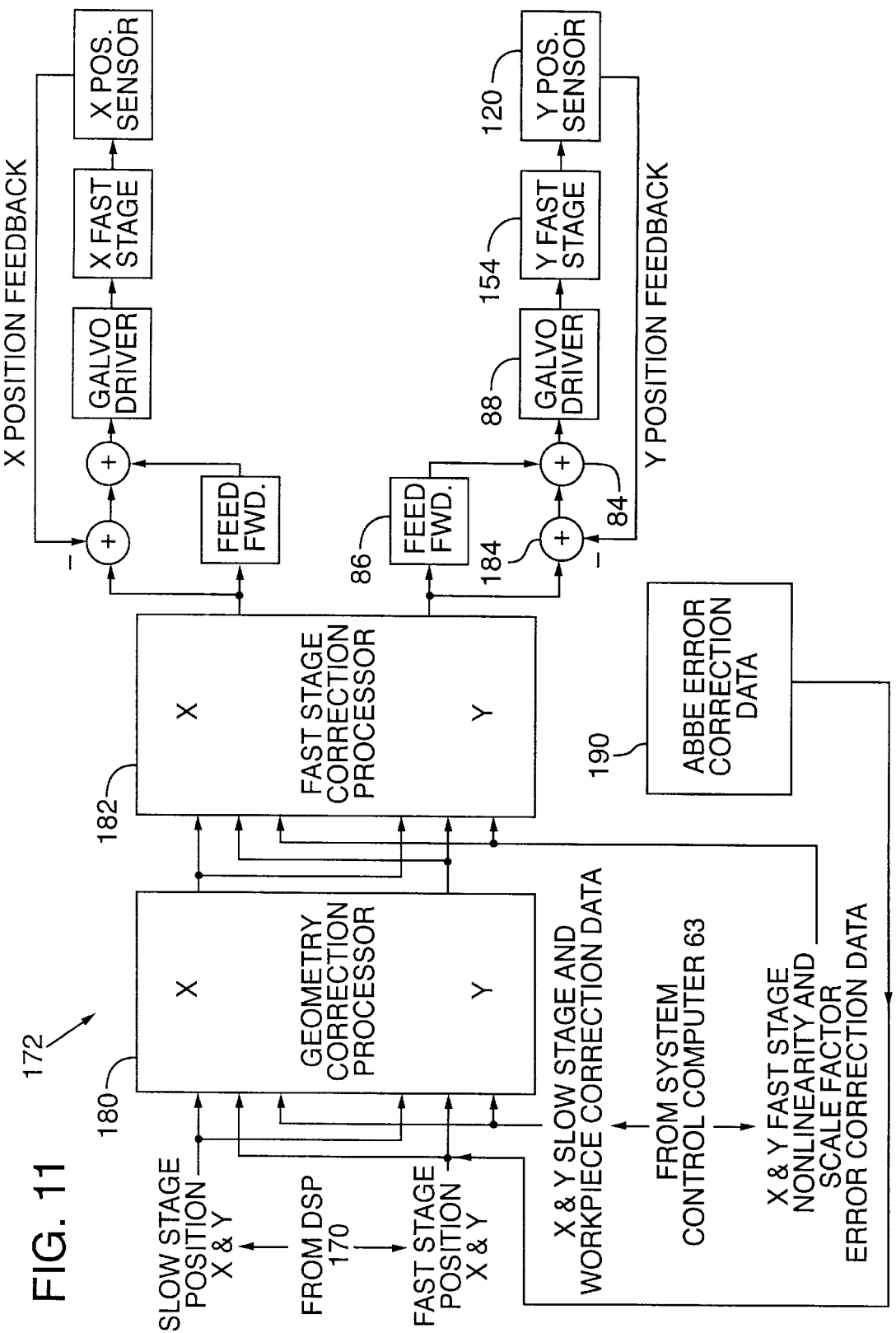
FIG. 11 is a simplified electrical block diagram of one of multiple fast stage signal processors employed in the digital signal processing system of FIG. 10.

FIG. 11 shows a representative one of fast stage signal processors 172 receiving fast and slow stage positioning data from DSP 170 and correction data from system control computer 63. The correction data include slow stage and workpiece related correction data that are conveyed to a geometry correction processor 180 and fast stage linearity and scale factor correction data that are conveyed to a fast stage correction processor 182. Skilled persons will appreciate that if fast stages 154 are mounted on separate X-axis stages 56, which preferably have synchronized movement but may be unsynchronized, then each such X-axis stage 56 may be commanded by its own processor 170 or subprocessor. Furthermore, each such stage 56 would preferably be equipped with its own position sensor 122 and five X-stage Abbe sensors to compensate for any Abbe errors associated with the individual stages.

The correction data may be equation- or lookup table-based. However, correction data employed by geometry correction processor 180 and fast stage correction processor are preferably equation-based along lines described in U.S. Pat. No. 4,941,082 of Pailthorp et al. ("the '082 patent"), which is assigned to the assignee of this application and is incorporated herein by reference.

Fast stage linearity and scale factor errors are relatively constant and depend mostly on the individual characteristics of fast stages 154. Therefore, fast stage correction processor 182 requires relatively small and infrequent correction data changes. Generating this correction data entails, for example, directing each of fast stages 154 to at least 13 calibration points on an associated calibration target as described in the '082 patent. A reflected energy detector senses any differences between the directed and actual target point locations and provides difference data to system control computer 63 for processing. The resulting correction data are conveyed to and stored in each fast stage correction processor 182. Also, any differences between the directed and actual target point locations sensed by associated video cameras 160 are calibrated and compensated for. Slow stage linearity and scale factor errors are also relatively constant and do not, therefore, require frequent correction data changes.

On the other hand, workpiece-related errors are relatively variable and depend mostly on workpiece placement, offset, rotation, and dimensional variations among workpieces 152. Therefore, geometry correction processor 180 requires relatively large correction data changes every time workpieces 152 are changed. Generating this correction data entails, for example, directing slow stages 56 and 58 to at least two, and preferably four, predetermined calibration targets on each associated workpiece 152. Alternatively, in an embodiment where the vision system is working through the fast positioner, both the slow stages 56 and 58 and fast stages 154 are directed toward the calibration targets. These calibration targets may be, for example, corners, tooling holes, or photoetch targets of an ECB. Each video camera 160 senses differences between the directed and actual calibration target locations and provides difference data to system control computer 63 for processing. The resulting correction data for each workpiece 152 are conveyed to and stored in the associated geometry correction processor 180.

For each fast stage signal processor 172, corrected positioning data for the Y-axis are conveyed from correction processors 180 and 182 to feed forward process 86, galvo driver 88, and fast stage 154. Position feedback data are generated by position sensor 120 (as in FIG. 2A) and combined for correction in adders 184 and 84. Skilled workers will understand that the same process applies to X-axis fast positioning.

In applying the correction data to fast stages 154, each fast stage is preferably limited to an 18 by 18 millimeter positioning range within its 20 by 20 millimeter maximum linear positioning range. The remaining 2 millimeters of positioning range is employed for applying the above-described corrections.

The foregoing describes signal processing for a single axis of motion for each of the fast and slow positioner stages. Skilled workers will readily understand how to replicate the signal processing to coordinate the motion of both axes, both stages, and single or multiple fast positioners.

EXAMPLE

A typical tool application employing positioner system 50 and including Abbe error correction is laser cutting of holes, such as blind via holes, in multilayer ECBs or other workpieces 62. Multilayer ECBs are typically manufactured by registering, stacking together, laminating, and pressing multiple 0.05- to 0.08-millimeter thick circuit board layers. Each layer typically contains a different interconnection pad and conductor pattern, which after processing constitutes a complex electrical component mounting and interconnection assembly. The component and conductor density trend of ECBs is increasing together with that of integrated circuits. Therefore, the positioning accuracy and dimensional tolerances of holes in ECBs is increasing proportionally.

Unfortunately, the pressing step causes expansion and dimensional variations that lead to scale factor and orthogonality variations among the ECBs. Moreover, when multiple ECBs (workpieces 152) are attached to slow stage 58, fixturing variations can cause dimensional rotation and offset errors among the ECBs. Adding to that, ECB thickness variations make it difficult to mechanically drill holes having an accurately predetermined depth.

Positioner systems 50 or 150 solve the above-described problems as follows. Two to four calibration targets can be etched at predetermined locations, preferably one at each corner, on each ECB. Video cameras 160 sense differences between the commanded and actual calibration target locations and provide difference data to system control computer 63 for processing. The resulting correction data are conveyed to and stored in geometry correction processor 180.

Two calibration targets provide sufficient difference data to system control computer 63 to correct for rotation and offset variations among the ECBs. Three calibration targets provide sufficient difference data to system control computer 63 to correct for rotation, offset, scale factor, and orthogonality variations among the ECBs. Adding a fourth calibration target further allows for correction of trapezoidal distortion in each of the ECBs.

ECB thickness variations are readily accommodated by the ±0.13-millimeter (±0.005 inch) laser depth of field.

Processing blind via holes presents a difficult challenge for any hole processing tool because of the tight depth, diameter, and positioning tolerances involved. This is because blind via holes are typically processed through a first conductor layer (e.g., copper, aluminum, gold, nickel, silver, palladium, tin, and lead), through one or more dielectric layers (e.g., polyimide, FR-4 resin, benzocyclobutene, bismaleimide triazine, cyanate ester-based resin, ceramic), and up to, but not through a second conductor layer. The resulting hole is plated with a conductive material to electrically connect the first and second conductor layers. Blind via processing windows are presented in detail U.S. Pat. No. 5,841,099 of Owen et al.

Referring again to FIG. 9, multi-head positioner 150 is configured as an ECB blind via cutting apparatus in which N equals an even number, such as 2, 4, or 6, but preferably 4. Lasers 156A and 156C are UV lasers (wavelength is less than about 400 nanometers and preferably about 355 or 266 nm), and lasers 156B and 156N are JR lasers (wavelength is in a range from about 1,000 nanometers to about 10,000 nanometers, preferably about 9,000 nanometers). Because the UV and IR lasers have substantially different wavelengths, mirrors 158 and optics for fast stages 154 are configured for compatibility with each associated laser's wavelength.

UV lasers 156A and 156C are capable of cutting both the first conductor layer and the dielectric layer in a suitable manner. However, the laser power levels and pulse repetition rates are carefully controlled to prevent unacceptable damage to the second conductor layer. This results in a narrow "process window." Therefore, UV lasers 156A and 156C are preferably employed to cut through only the first conductor layer and a portion of the dielectric layer, a process that has a wide process window. Once the first conductor layer is removed by the UV lasers 156, IR lasers 156B and 156N, which have a wide process window for cutting through the remaining dielectric layer without cutting through or damaging the second conductor layer, are employed to remove the last portion of the dielectric layer. Thus, the ECB blind via cutting apparatus employs UV lasers 156A and 156C to cut through the first conductor layers of workpieces 152A and 152C and IR lasers 156B and 156N to cut through the dielectric layers on workpieces 152B and, 152N.

The time required for UV lasers 156A and 156C to cut through the conductor layers is typically longer than the time required by IR lasers 152B and 152N to cut through the dielectric layer. Therefore, the longer processing time dictates the processing throughput. Because the target locations are substantially identical for all tools on multi-tool positioner 150, the different processing times are accounted for by providing appropriately different laser power levels and pulse repetition rates for the UV and IR lasers.

Some applications require cutting relatively large hole diameters of about 200 micrometers or less. Because UV lasers 154A and 154C have a beam diameter of only about 20 micrometers, multi-tool positioner 150 must cause the UV beam to follow a spiral or circular path to cut such holes in a conductor layer. Therefore, cutting these relatively large holes takes a proportionally longer time. However, IR lasers 154B and 154N have a beam diameter of about 400 micrometers, which is about 20 times the UV laser beam diameter. Therefore, when cutting these relatively large diameter holes through the dielectric layers, at least some portion of the IR laser beam will cover the entire hole while the UV beam follows the spiral or circular path to cut a hole in a conductor layer. Under these circumstances, the IR laser beams are on the target locations for a relatively longer time and the different effective processing times are again accounted for by providing appropriately different laser power levels and pulse repetition rates for the UV and IR lasers.

If suitable laser power is available, a single laser may be shared among multiple workpieces by employing suitable power splitting devices. It is also envisioned that switchable-wavelength lasers may be employed in this invention.

This invention provides an improved combination of positioning accuracy, positioning speed, minimized or eliminated stopping time, nonpanelized tool path databases, and minimized fast stage movement range that dramatically improves processing throughput while reducing workpiece rejects caused by dimensional and orientation variations.

Skilled workers will recognize that portions of this invention may be implemented differently from the laser beam micro-machining implementation described above. For example, a wide variety of tools, in single or multi-headed configurations, may be moved by the fast positioner stage, such as micro-dimensioned drills, punches, lasers, laser beams, radiation beams, particle beams, beam producing devices, microscopes, lenses, optical instruments, and cameras. Also, many different positioning devices may be employed in different combinations drawn from among galvanometers, voice coils, piezoelectric transducers, stepper motors, and lead screw positioners. The DSPs need not be completely digital and may, for example, include any suitable combination of analog and digital subcircuits. Of course, the positioning signal profiles, spectral bandwidth and amplitudes, and filter characteristics described herein may all be modified to suit the requirements of other positioning applications.

It will be obvious to skilled workers that many other changes may be made to the details of the above-described embodiments of this invention without departing from the underlying principles thereof. The scope of the present invention should, therefore, be determined only by the following claims.

What is claimed is:

1. A positioning system for positioning a tool relative to a target location on a workpiece in response to a positioning command, comprising:

a slow positioner for effecting a large range of relative movement between the tool and the workpiece, the slow positioner including a translation stage capable of movement generally along an axis;

a fast positioner for effecting small ranges of relative movement between the tool and the workpiece;

a positioning signal processor for deriving from the positioning command slow and fast movement-controlling signals;

a slow positioner driver for controlling the large range of relative movement of the translation stage in response to the slow movement-controlling signal;

a fast positioner driver for controlling the small ranges of relative movement of the fast positioner in response to the fast movement-controlling signal;

a pair of spaced-apart displacement sensors in communication with the fast positioner driver and coupled to move with the translation stage along the axis; and a reference surface positioned in proximity to the translation stage and parallel to the axis, the translation stage being capable of moving along the reference surface and the displacement sensors being capable of acquiring information concerning their relative distances from the reference surface and conveying the information to the fast positioner driver to correct for an Abbe error associated with off-axis or rotational movement of the translation stage.

2. The positioning system of claim 1 in which the rotational movement is yaw.

3. The positioning system of claim 1 in which:
the translation stage is a first translation stage that supports workpiece;
the slow positioner further comprises a second translation stage capable of moving along a second axis that is transverse to the first axis; and
the fast positioner is mounted on the second translation stage.

4. The positioning system of claim 3 in which first and second translation stages carry respective first and second inertial masses.

5. The positioning system of claim 3 in which the fast positioner is a first fast positioner, and in which the second translation stage supports a second fast positioner.

6. The positioning system of claim 3 in which multiple workpieces are mounted on the first translation stage.

7. The positioning system of claim 3 in which the second translation stage comprises a second pair of spaced-apart displacement sensors in communication with the fast positioner driver and coupled to move with the second translation stage along the second axis, and in which a second reference surface is positioned in proximity to the second translation stage and parallel to the second axis, the second translation stage being capable of moving along the second reference surface and the second displacement sensors being capable of acquiring second information concerning their relative distances from the second reference surface and conveying the second information to the fast positioner driver to correct for a second Abbe error associated with second off-axis or rotational movement of the second translation stage.

8. The positioning system of claim 7 in which the second rotational movement is pitch or yaw.

9. The positioning system of claim 7 in which the second translation stage comprises a third pair of spaced-apart displacement sensors in communication with the fast positioner driver and coupled to move with the second translation stage along the second axis, and in which a third reference surface is positioned in proximity to the second translation stage, parallel to the second axis, the second translation stage being capable of moving along the third reference surface and the third displacement sensors being capable of acquiring third information concerning their relative distances from the third reference surface and conveying the third information to the fast positioner driver to correct for a third Abbe error associated with third off-axis or rotational movement of the second translation stage.

10. The positioning system of claim 9 in which the third rotational movement is pitch or yaw.

11. The positioning system of claim 9 in which the second translation stage comprises a fourth displacement sensor in communication with the fast positioner driver and coupled to move with the second translation stage in a plane including the second axis, and in which a fourth reference surface is positioned in proximity to the second translation stage, parallel to the second axis, and in a second plane generally including the second reference surface, the second translation stage being capable of moving along the fourth reference surface and the fourth displacement sensor in cooperation with one of the second displacement sensors being capable of acquiring fourth information concerning their relative distances from the respective fourth and second reference surfaces and conveying the fourth information to the fast positioner driver to correct for a fourth Abbe error associated with fourth off-axis or rotational movement of the second translation stage.

12. The positioning system of claim 9 in which the fourth rotational movement is roll.

13. The positioning system of claim 1 in which the displacement sensors comprise capacitive sensors.

14. The positioning system of claim 2 in which the displacement sensors are capable of discerning relative distances as small as 10 nm.

15. The positioning system of claim 1 in which the displacement sensors are capable of measuring relative distances as large as 50 $\mu$m.

16. The positioning system of claim 1 in which the tool is a laser beam.

17. The positioning system of claim 1 in which the displacement sensors are in communication with the positioning signal processor for adjustment at the positioning signal processor of the fast movement-controlling signal based on the information acquired by the displacement sensors, to thereby achieve real time compensation for the abbe error.

18. A positioning system for positioning a laser beam relative to a target location on a workpiece in response to a positioning command, comprising:
a first positioner effecting a large range of relative movement between the laser beam and the workpiece, the first positioner including a first translation stage capable of supporting the workpiece in plane and moving generally along a first axis;
a fixed optical head including a fixed optical path directed at, and transverse to, the plane of the workpiece;
a second positioner effecting a large range of relative movement between the laser beam and the workpiece, the second positioner including a second translation stage capable of supporting the fixed optical head and moving generally along a second axis that is transverse to the first axis;
a positioning signal processor deriving from the positioning command movement-controlling signals;
first and second positioner drivers controlling the large range of relative movement of the respective first and second translation stages in response to the movement-controlling signals;
a pair of spaced-apart first displacement sensors in communication with the positioner driver and coupled to move with the first translation stage along the first axis; and
a first reference surface positioned in proximity to the first translation stage and parallel to the first axis, the first translation stage being capable of moving along the first reference surface and the first displacement sensors being capable of acquiring information concerning their relative distances from the first reference surface and conveying the information to the positioner driver to correct for an Abbe error associated with off-axis or rotational movement of the first translation stage.

19. The positioning system of claim 18 in which the rotational movement is yaw.

20. The positioning system of claim 18 in which:
the translation stage is a first translation stage that supports a workpiece;
the slow positioner further comprises a second translation stage capable of moving along a second axis that is transverse to the first axis; and
the fast positioner is mounted on the second translation stage.

21. The positioning system of claim 20 in which first and second translation stages carry respective first and second inertial masses.

22. The positioning system of claim 20 in which the fast positioner is a first fast positioner, and in which the second translation stage supports a second fast positioner.

23. The positioning system of claim 20 in which multiple workpieces are mounted on the first translation stage.

24. The positioning system of claim 20 in which the second translation stage comprises a second pair of spaced-apart displacement sensors in communication with the fast positioner driver and coupled to move with the second translation stage along the second axis, and in which a second reference surface is positioned in proximity to the second translation stage and parallel to the second axis, the second translation stage being capable of moving along the second reference surface and the second displacement sensors being capable of acquiring second information concerning their relative distances from the second reference surface and conveying the second information to the fast positioner driver to correct for a second Abbe error associated with second off-axis or rotational movement of the second translation stage.

25. The positioning system of claim 24 in which the second rotational movement is pitch or yaw.

26. The positioning system of claim 24 in which the second translation stage comprises a third pair of spaced-apart displacement sensors coupled to move with the second translation stage along the second axis and in communication with the fast positioner driver, and in which a third reference surface is positioned in proximity to the second translation stage, parallel to the second axis, and transverse to the second reference surface, the second translation stage being capable of moving along the third reference surface and the third displacement sensors being capable of acquiring third information concerning their relative distances from the third reference surface and conveying the third information to the fast positioner driver to correct for a third Abbe error associated with third off-axis movement of the second translation stage.

27. The positioning system of claim 26 in which the third rotational movement is pitch or yaw.

28. The positioning system of claim 26 in which the second translation stage comprises a fourth displacement sensor coupled to move with the second translation stage in a plane including the second axis and in communication with the fast positioner driver, and in which a fourth reference surface is positioned in proximity to the second translation stage, parallel to the second axis, and in a second plane generally including the second reference surface, the second translation stage being capable of moving along the fourth reference surface and the fourth displacement sensor in cooperation with one of the second displacement sensors being capable of acquiring fourth information concerning their relative distances from the respective fourth and second reference surfaces and conveying the fourth information to the fast positioner driver to correct for a fourth Abbe error associated with fourth off-axis movement of the second translation stage.

29. The positioning system of claim 26 in which the fourth rotational movement is roll.

30. The positioning system of claim 18 in which the displacement sensors comprise capacitive sensors.

31. The positioning system of claim 18 in which the displacement sensors discern relative distances as small as 10 nm.

32. The positioning system of claim 18 in which the displacement sensors measure relative distances as large as 50 $\mu$m.

33. The positioning system of claim 18 in which the displacement sensors are in communication with the positioning signal processor for adjustment at the positioning signal processor of the fast movement-controlling signal based on the information acquired by the displacement sensors, to thereby achieve real time compensation for the abbe error.

34. A method for positioning laser output relative to a target location on a workpiece, comprising:
providing slow and fast movement-controlling signals from a positioning signal processor;
controlling with a slow positioner driver a large range of relative movement of a translation stage, generally along an axis and along a reference surface positioned in proximity to the translation stage and parallel to the axis, in response to the slow movement-controlling signal;
controlling with a fast positioner driver a small range of relative movement of a fast positioner in response to the fast movement-controlling signal;
effecting the large range of relative movement between the laser output and the workpiece on the translation stage;
acquiring, with a pair of spaced-apart displacement sensors coupled to move with the translation stage along the axis, information concerning their relative distances from the reference surface;
conveying the information from the displacement sensors to the fast positioner driver;
effecting with a fast positioner the small range of relative movement between the laser output and the workpiece including a correction for an Abbe error associated with off-axis or rotational movement of the translation stage; and
generating laser output to impinge the target location on the workpiece.

35. The method of claim 34 in which the rotational movement is yaw.

36. The method of claim 34 in which:
the translation stage is a first translation stage that supports a workpiece;
the slow positioner further comprises a second translation stage capable of moving along a second axis that is transverse to the first axis; and
the fast positioner is mounted on the second translation stage.

37. The method of claim 36 in which first and second translation stages carry respective first and second inertial masses.

38. The method of claim 36 in which the fast positioner is a first fast positioner, and in which the second translation stage supports a second fast positioner.

39. The method of claim 36 in which multiple workpieces are mounted on the first translation stage.

40. The method of claim 36 in which the second translation stage comprises a second pair of spaced-apart displacement sensors in communication with the fast positioner driver and coupled to move with the second translation stage along the second axis, and in which a second reference surface is positioned in proximity to the second translation stage and parallel to the second axis, the second translation stage being capable of moving along the second reference surface and the second displacement sensors being capable of acquiring second information concerning their relative distances from the second reference surface and conveying the second information to the fast positioner driver to correct for a second Abbe error associated with second off-axis or rotational movement of the second translation stage.

41. The method of claim 40 in which the second rotational movement is pitch or yaw.

42. The method of claim 40 in which the second translation stage comprises a third pair of spaced-apart displacement sensors in communication with the fast positioner driver and coupled to move with the second translation stage along the second axis, and in which a third reference surface is positioned in proximity to the second translation stage, parallel to the second axis, the second translation stage being capable of moving along the third reference surface and the third displacement sensors being capable of acquiring third information concerning their relative distances from the third reference surface and conveying the third information to the fast positioner driver to correct for a third Abbe error associated with third off-axis or rotational movement of the second translation stage.

43. The method of claim 42 in which the third rotational movement is pitch or yaw.

44. The method of claim 42 in which the second translation stage comprises a fourth displacement sensor in communication with the fast positioner driver and coupled to move with the second translation stage in a plane including the second axis, and in which a fourth reference surface is positioned in proximity to the second translation stage, parallel to the second axis, and in a second plane generally including the second reference surface, the second translation stage being capable of moving along the fourth reference surface and the fourth displacement sensor in cooperation with one of the second displacement sensors being capable of acquiring fourth information concerning their relative distances from the respective fourth and second reference surfaces and conveying the fourth information to the fast positioner driver to correct for a fourth Abbe error associated with fourth off-axis or rotational movement of the second translation stage.

45. The method of claim 42 in which the fourth rotational movement is roll.

46. The method of claim 34 in which the displacement sensors comprise capacitive sensors.

47. The method of claim 34 in which the displacement sensors are capable of discerning relative distances as small as 10 nm.

48. The method of claim 34 in which the displacement sensors are capable of measuring relative distances as large as 50 $\mu$m.

49. The method of claim 34 in which the conveying of the information from the displacement sensors to the fast positioner driver includes receipt of the information at the positioning signal processor and adjustment at the positioning signal processor of the fast movement-controlling signal based on the received information, to thereby achieve real time compensation for the abbe error.

50. A positioning system for positioning a tool relative to a workpiece in response to a positioning command, comprising:

a slow positioner including a translation stage capable of movement generally along an axis;

a fast positioner in operative association with the tool for effecting movement of the tool relative to the workpiece;

a fast positioner driver for controlling the movement of the fast positioner in response to the positioning command;

a reference surface; and a pair of spaced-apart displacement sensors positioned in proximity to the reference surface, the movement of the translation stage causing the pair of sensors to move along the reference surface, the displacement sensors being capable of sensing their respective distances from the reference surface, and the fast positioner driver being responsive to the displacement sensors by adjusting the position of the tool relative to the workpiece based on the distances sensed by the displacement sensors, to thereby compensate for an abbe error associated with off-axis or rotational movement of the translation stage.

51. The positioning system of claim 50 in which the tool includes a laser beam.

52. The positioning system of claim 50 in which:

the translation stage is a first translation stage that supports the workpiece;

the slow positioner further comprises a second translation stage capable of moving along a second axis that is transverse of the first axis; and the fast positioner is supported on the second translation stage for movement therewith.

53. The positioning system of claim 52 in which the fast positioner includes multiple fast positioners in operative association with multiple tools for effecting movement of the tools relative to one or more workpieces supported on the first translation stage.

54. The positioning system of claim 52 further comprising:

a second reference surface; and a second pair of spaced-apart displacement sensors positioned in proximity to the second reference surface, the movement of the second translation stage causing the second pair of sensors to move along the second reference surface, the second displacement sensors being capable of sensing their respective distances from the second reference surface, and the fast positioner driver being responsive to the second displacement sensors by adjusting the position of the tool relative to the workpiece based on the distances sensed by the second displacement sensors, to thereby compensate for an abbe error associated with off-axis or rotational movement of the second translation stage.

55. The positioning system of claim 50 in which the displacement sensors comprise capacitive sensors.

56. The positioning system of claim 50 further comprising:

a positioning signal processor for deriving from the positioning command slow and fast movement-controlling signals;

a slow positioner driver for controlling the movement of the translation stage in response to the slow movement-controlling signal; and in which the fast positioner driver is responsive to the fast movement-controlling signal to effect movement of the fast positioner and the displacement sensors are in communication with the positioning signal processor for adjustment at the positioning signal processor of the fast movement-controlling signal based on the distances measured by the displacement sensors, to thereby achieve real time compensation for the abbe error.

* * * * *

UNITED STATES PATENT AND TRADEMARK OFFICE
CERTIFICATE OF CORRECTION

PATENT NO. : 6,430,465 B2
DATED : August 6, 2002
INVENTOR(S) : Donald R. Cutler

It is certified that error appears in the above-identified patent and that said Letters Patent is hereby corrected as shown below:

Column 3,
Line 57, "galvanometer driven" should read -- galvanometer-driven --.

Column 9,
Line 10, "role" should read -- roll --;
Line 32, "145" and roll probe driver 146" should read -- 146 and roll probe drive 147 --.

Column 10,
Line 7, "Yaxis" should read -- Y-axis --;
Line 12, "Y-axis 58" should read -- Y-xis stage 58 --.

Column 11,
Line 36, after "correction processor" insert -- 182 --.

Column 12,
Line 4, "comers" should read -- corners --.

Column 13,
Line 23, "JR" should read -- IR --;
Line 39, "156" should read -- 156A and 156C --;
Line 47, "152B and, 152N" should read -- 152B and 152N --;
Line 50, "152B and 152N" should read -- 156B and 156N --;
Line 60, "154A and 154C" should read -- 156A and 156C --;
Line 65, "154B and 154N" should read -- 156B and 156N --.

Column 15,
Line 14, after "supports" insert -- a --.

Column 16,
Line 15, "Claim 2" should read -- Claim 1 --;
Line 36, after "in" insert -- a --.

UNITED STATES PATENT AND TRADEMARK OFFICE
CERTIFICATE OF CORRECTION

PATENT NO. : 6,430,465 B2
DATED : August 6, 2002
INVENTOR(S) : Donald R. Cutler

It is certified that error appears in the above-identified patent and that said Letters Patent is hereby corrected as shown below:

Column 17,
Line 64, "claim 26" should read -- claim 28 --.

Column 20,
Line 29, "claim 52 further" should read -- claim 52, further --;
Line 47, "50 further" should read -- 50, further --.

Signed and Sealed this

Thirtieth Day of September, 2003

JAMES E. ROGAN
*Director of the United States Patent and Trademark Office*